United States Patent
Tangi et al.

(10) Patent No.: US 6,281,157 B1
(45) Date of Patent: Aug. 28, 2001

(54) SELF-CATALYTIC BATH AND METHOD FOR THE DEPOSITION OF A NICKEL-PHOSPHORUS ALLOY ON A SUBSTRATE

(75) Inventors: Abdallah Tangi, Mohammedia; Mohamed Elhark, Casablanca; Ali Ben Bachir; Abdellah Srhiri, both of Kenitra; Mohamed Cherkaoui, Rabat; Mohamed Ebntouhami, Région de Rabat; El Mustapha Saaoudi, Région de Kenitra, all of (MA)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/624,678

(22) Filed: Jul. 24, 2000

Related U.S. Application Data

(62) Division of application No. 09/157,737, filed on Sep. 21, 1998, now Pat. No. 6,143,059, which is a continuation of application No. 08/954,193, filed on Oct. 20, 1997, now abandoned.

(30) Foreign Application Priority Data

Oct. 21, 1996 (FR) .................................................. 96 12763

(51) Int. Cl.⁷ ............................. B01J 27/14; B01J 27/185
(52) U.S. Cl. ........................... 502/213; 502/208; 502/22; 502/25; 502/26; 502/27; 502/28; 502/29; 502/33; 427/430.1; 427/435; 427/436; 427/437; 427/438

(58) Field of Search ...................................... 502/208, 213, 502/22, 25, 26, 27, 28, 29, 33; 427/430.1, 435, 436, 437, 438

(56) References Cited

U.S. PATENT DOCUMENTS

| 4,019,901 | 4/1977 | Mallory, Jr. .......................... 106/1.22 |
| 4,038,085 | 7/1977 | Scannell ................................ 106/1.22 |
| 4,152,164 | 5/1979 | Gulla et al. .......................... 106/1.27 |
| 5,221,328 | 6/1993 | Bishop et al. ....................... 106/1.27 |
| 5,614,003 | 3/1997 | Mallory, Jr. .......................... 106/1.22 |
| 5,718,745 | 2/1998 | Itoh et al. ............................ 106/1.22 |

*Primary Examiner*—Elizabeth D. Wood
(74) *Attorney, Agent, or Firm*—Wolf, Greenfield & Sacks, P.C.; James H. Morris; Theodore E. Galanthay

(57) ABSTRACT

Disclosed are a self-catalytic bath and a method for the deposition of Ni—P alloy on a substrate. The bath comprises nickel sulfate, sodium hypophosphite as a reducing agent, acetic acid as a buffer and traces of lead as a stabilizer. It also includes a citrate used as a complexing agent associated with a gluconate used both as a catalyst and a stabilizer. The disclosed bath makes it possible to tolerate large quantities of hypophosphite and is relatively long-lived. Furthermore, it can be used to prepare large quantities of Ni—P alloy per liter of solution.

13 Claims, 2 Drawing Sheets

| QUANTITIES OF PRODUCTS | NICKEL SULFATE | NICKEL IONS | HYPOPHOSPHITE | CITRATE | GLUCONATE | ACETIC ACID | AMMONIA DILUTED TO 10% |
|---|---|---|---|---|---|---|---|
| FOR THE MOUNTING OF THE BATH | 0.1M 26g/l | 0.1M 6g/l | 0.33M 29g/l | 0.15M 44g/l | 0.092M 20g/l | 13.6ml | 0 |
| FOR THE REGENERATION OF THE BATH | 0.59M 155g/l | 0.59M 35.76g/l | 2.27M 200g/l | 0.12M 35g/l | 0 | 0 | 100ml |
| TO DEPOSIT 1g OF Ni–P | 4.76g/l | 1.09g/l | 6.02g/l | 2.07g/l | 0.52g/l | 0.35ml | 2.63ml |

| QUANTITIES OF PRODUCTS | NICKEL SULFATE | NICKEL IONS | HYPOPHOSPHITE | CITRATE | GLUCONATE | ACETIC ACID | AMMONIA DILUTED TO 10% |
|---|---|---|---|---|---|---|---|
| FOR THE MOUNTING OF THE BATH | 0.1M 26g/l | 0.1M 6g/l | 0.33M 29g/l | 0.15M 44g/l | 0.092M 20g/l | 13.6ml | 0 |
| FOR THE REGENERATION OF THE BATH | 0.59M 155g/l | 0.59M 35.76g/l | 2.27M 200g/l | 0.12M 35g/l | 0 | 0 | 100ml |
| TO DEPOSIT 1g OF Ni–P | 4.76g/l | 1.09g/l | 6.02g/l | 2.07g/l | 0.52g/l | 0.35ml | 2.63ml |

FIG. 3

SELF-CATALYTIC BATH AND METHOD FOR THE DEPOSITION OF A NICKEL-PHOSPHORUS ALLOY ON A SUBSTRATE

CROSS REFERENCE TO RELATED APPLICATIONS

This application is a division of application Ser. No. 09/157,737, filed Sep. 21, 1998, now U.S. Pat. No. 6,143,059, which in turn is a continuation of application Ser. No. 08/954,193, filed Oct. 20, 1997, and now abandoned, which prior applications are incorporated herein by reference.

FIELD OF THE INVENTION

1. Field of the Invention

The present invention relates to the formulation of a bath enabling the preparation of a deposit of nickel-phosphorus (Ni—P) alloy on substrates used in the manufacture of printed circuit wafers and more particularly, to deposition of such alloys by chemical self-catalysis.

2. Discussion of the Related Art

Existing nickel baths are all relatively short-lived. Typical nickel baths include combinations of complexing agents, buffers and stabilizers as well as nickel salt and phosphites. Typical complexing agents have included lactic acid, maleic acid, aspartic acid, propionic acid, succinic acid, citric acid, etc. Several different complexing agents are generally associated with one another. It is known that the complexing agents, and especially citric acid or its derivatives, are incapable of tolerating large quantities of phosphites. The phosphite content determines the quantity of phosphorus that can be deposited, and hence the lifetime of the bath. Therefore, depletion of the bath's phosphite content decreases the bath lifetime.

Due to the short lifetimes of baths that presently exist in the market, it is very difficult to create conditions for making the deposits. It is known that a small quantity of citric acid or of one of its derivatives causes a rapid decomposition of these baths by the precipitation of nickel phosphites, therefore, citric acid and its derivatives are not typically used as complexing agents. In addition, stabilizers are reputed to be poisons in the self-catalytic reaction, and therefore require handling with care. At present, the use of gluconates has been limited to cleansing solutions.

Therefore, due to the difficulties associated with creating the conditions necessary for making such deposits, the quality of the coatings is reduced and their cost price remains very high.

SUMMARY OF THE INVENTION

The present invention provides a self-catalytic bath having a longer lifetime than presently existing baths. The bath according to the present invention includes nickel sulfate, sodium hypophosphite as a reducing agent, acetic acid as a buffer, and traces of lead as a stabilizer. More particularly, the bath includes a citrate complexing agent, associated with a gluconate used both as a catalyst and a stabilizer. In preferred embodiments, the citrate is sodium tricitrate and the gluconate is sodium gluconate.

Advantages provided by the bath includes high quality deposits, very high deposition rates, easy handling, and simple conditions of implementation. In addition, such deposits can also be made on non-conductive substrates.

The bath according to the invention can tolerate large quantities of hypophosphite, thereby considerably increasing its lifetime. When used in continuous operation, the bath can provide about 38 grams of Ni—P alloy per liter of solution. Furthermore, the bath according to the invention can be used to obtain amorphous deposits containing 13% by weight of phosphorus. Such deposits have a decorative appearance, greatly improved adhesion and hardness, and high corrosion resistance.

In another aspect, the present invention provides a method for the deposition of Ni—P alloy on a substrate by self-catalytic chemical means. The method involves plunging a substrate directly into the bath described above. Preferably, the substrate is made of iron, mild steel, copper or again of a non-conductive material.

BRIEF DESCRIPTION OF THE DRAWINGS

Other particular features and advantages of the invention shall appear from the following description given by way of an illustrative and non-restrictive example, with reference to the appended figures of which:

FIG. 3 is a table showing all the values of the proportions of constituents needed to make a bath according to the invention.

DETAILED DESCRIPTION

Figure 1:
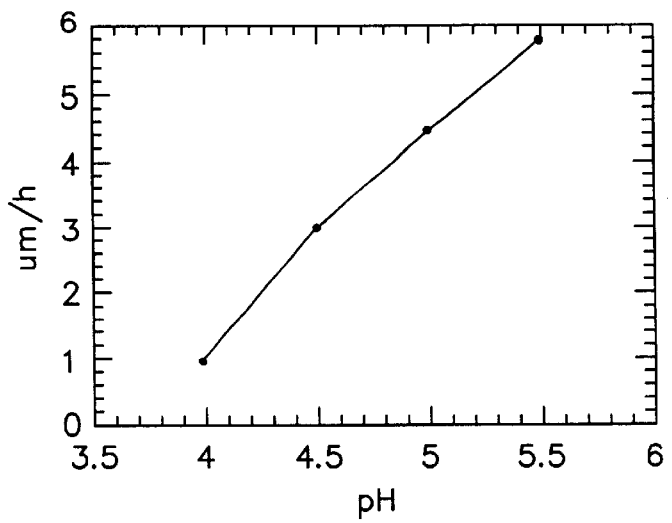
FIG. 1 is a curve showing the influence of the pH of the solution on the speed of deposition.

The present invention provides formulations and methods for depositing nickel-phosphorus alloys. The bath formulation includes nickel sulfate, sodium hypophosphite as a reducing agent, acetic acid as a buffer, traces of lead as a stabilizer, and a citrate complexing agent, associated with a gluconate used both as a catalyst and a stabilizer.

According to the method, prior to deposition, it is necessary to carry out a surface treatment of the substrate in order to remove any surface oxide. Such surface treatment plays a major role, for an oxidized substrate may lower the quality of the samples and pollute the electrolyte. The surface treatment involves polishing the substrates mechanically 40 a grain size of 1,200, followed by degreasing with acetone and cleansing with a 10% sulfuric acid solution, and finally, rinsing with distilled water. The substrates used may, for example, be designed for the manufacture of printed circuit wafers, and may typically be made of iron, copper, or mild steel. Of course, this list of materials is not exhaustive and other types of substrates may be used, including non-conductive substrates. The deposition of nickel-phosphorus alloys on such substrates provides corrosion protection, makes them suitable for welding, and gives a shiny appearance.

Copper substrates do not catalyze the deposition operation, and therefore require a polarization of −1600 mV with respect to a reference electrode to be applied to it in order to initiate the self-catalytic process. Such an electrode is typically made of Ag—AgCl (a silver chloride electrode).

Several electrolytes presented hereinafter have been made and their properties have been compared in order to bring out the advantages provided by the bath according to the present invention. The deposits of Ni—P alloy were made on substrates of mild steel, iron or copper.

Coatings prepared in the presence of citrate as a complexing agent show higher resistance to corrosion, which is why sodium tricitrate is used. Advantageously, the reagents used in the composition do not contain any chloride, for the Cl⁻ ions prompt a corrosion of the vessels that are used in industrial-scale manufacture.

The composition of a first electrolyte (hereinafter called "electrolyte I") enabling the preparation of the coatings of the alloy Ni—P, and which does not include a catalyst, was formulated to include nickel phosphate, sodium hypophosphite and sodium triacetate in the following proportions:

0.1 M $NiSO_4$:$6H_2O$ (nickel sulfate @26 g/l);
0.28 M $NaH_2PO_2$:$H_2O$ (sodium hypophosphite @24.6 g/l); and
0.2 M $Na_3C_6H_5O_7$:$2H_2O$ (sodium tricitrate @58.8 g/l).

The initial pH was set at 5.5 by the addition of an acetic acid buffer, preferably 13.6 ml of acetic acid, for a solution concentration of 0.024 M $CH_3CO_2H$. The temperature was adjusted and maintained at T=87±2° C., by placing the cell containing the bath into a thermostat-controlled bath. This formulation gives only about 0.5 g of Ni—P alloy per liter of solution, due to the fact that the use of sodium tricitrate at 0.2 M leads to the rapid decomposition of the bath by the precipitation of nickel phosphite after 10 minutes of operation.

The potential of deposition and the pH do not vary during the self-catalytic reaction. This is due to the fact that the buffer used, namely acetic acid, is of good quality. Furthermore, the curve of FIG. 1, representing the effect of the pH on the speed of deposition, shows that when the pH goes from 4 to 6, the speed of deposition of this bath increases from 1 to 5.8 μm/h. This phenomenon can be explained by the fact that the value of the pH plays a major role in the reaction of the oxidation of hypophosphite ($H_2PO_2^-$). For this reason, the value of the pH of the electrolyte I has been set at 5.5.

The speed of deposition obtained is in the range of 5 μm/h, which is below the standard required industrially which is in the range of 8 to 10 μm/h. Therefore, to improve the speed of deposition and the lifetime of the bath, organic compounds have been added and certain operational parameters have been modified. It has been found that the concentration of complexing agent influences the depositions speed. Therefore, the concentration of sodium citrate is reduced compared to electrolyte I. It has also been found that the addition of certain catalysts can stabilize the bath and increase the deposition speed. Accordingly, the composition of the second resultant electrolyte, called "electrolyte II", corresponding to the bath according to the invention, is as follows:

0.1 M $NiSO_4$:$6H_2O$ (nickel sulfate @ 26 g/l);
0.33 M $NaH_2PO_2$:$H_2O$ (sodium hypophosphite @ 29 g/l);
0.15 M $Na_3C_6H_5O_7$:$2H_2O$ (sodium tricitrate @ 44 g/l); and
0.092 M $C_6H_{11}NaO_7$ (sodium gluconate @ 20 g/l).

As previously described, the pH is set at 5.5 by the addition of acetic acid, which acts as a buffer. The addition of the complexing agent reduces the value of the concentration in free metal ions [$M^{n+}$] by several magnitudes and thus reduces the potential $E_m$, thus providing a possibility of controlling the kinetics during deposition, as set forth in the following equations.

The reduction of the metal ions is given by the reaction:

$$M^{n+} + ne^- \rightarrow M^o$$

The corresponding potential is written as follows:

$$Em = E^o(M^{n+}/M) + 2.3RT/nf \log([M^{n+}free]/[M]).$$

Figure 2:
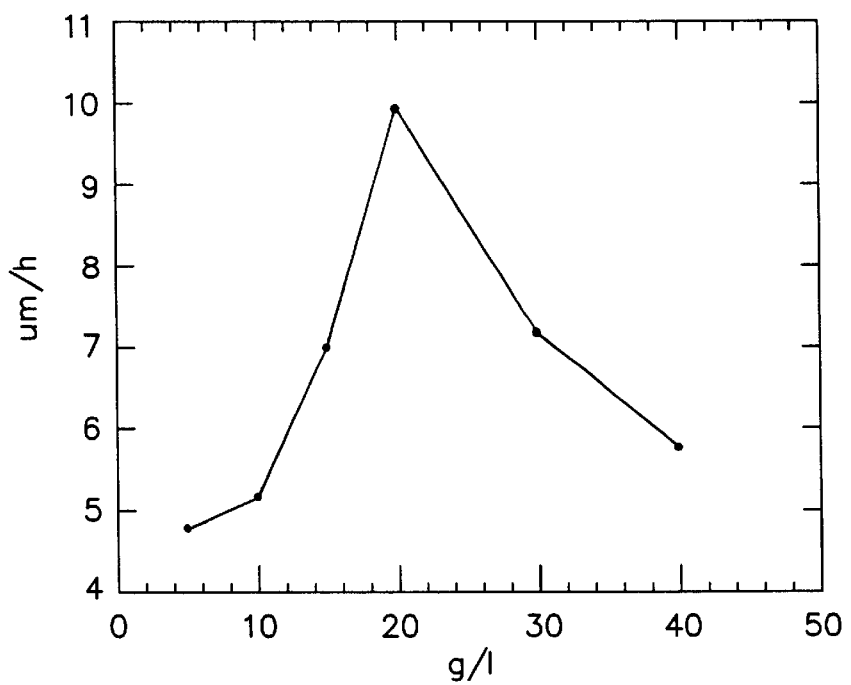
FIG. 2 is a curve showing the influence of the concentration in catalyst on the speed of deposition.

The choice of a gluconate as a catalyst can be explained by the fact that this type of compound contains hydroxide functions capable of picking up the H⁺ protons, thus preventing their adsorption on the surface of the substrate and the blocking of the active sites. The catalysts eliminating ions likely to occupy active sites and therefore accelerate the deposition process. The use of sodium tricitrate without a catalyst, specifically gluconate, leads to the decomposition of the bath after 10 minutes of operation. An initial interpretation of these results would be that it is the diminishing of the concentration in citrates that increases the speed of deposition while gluconate only stabilizes the bath. However, it has been found that the deposition speed varies greatly depending on the gluconate concentration. The curve of FIG. 2, indicating the variation of the speed of deposition as a function of the gluconate concentration, has a shape which is typical of that of a catalyst. Consequently, the gluconate, in addition to its stabilizing role, is used to substantially increase the speed of deposition. Indeed, FIG. 2 shows that the speed of deposition increases with the gluconate concentration to reach a maximum speed of 10 μm/h at a concentration of 20 g/l. This is the maximum concentration beyond which a slowing down of the kinetics is observed. The existence of a maximum speed shows that, for quantities greater than 20 g/l, the gluconate behaves like a complexing agent. This feature is probably related to the stabilizing role of this type of compound.

The self-catalytic bath is preferably made with two solutions of identical volumes which are mixed in an electrolytic cell. In a preferred embodiment, a one liter bath prepared by mixing 500 ml of first and second solution in an electrolytic cell. Preferably, the first solution is prepared to include 0.1 M $NiSO_4$:$6H_2O$ (nickel sulfate @ 26 g/l);
0.15 M $Na_3C_6H_5O_7$:$2H_2O$ (sodium tricitrate @ 44.11 g/l), and
$CH_3CO_2H$ 13.6 ml/l (acetic acid @13.6 ml/l ).

The second solution is prepared to include:

0.33 M $NaH_2PO_2$:$H_2O$ (sodium hypophosphite @29 g/l),
0.092 M $C_6H_{11}NaO_7$ (sodium gluconate @ 20 g/l), and traces of lead.

To determine the lifetime of the bath and the weight of Ni—P alloy that can be prepared per liter of solution, the electrolyte must work and be regenerated continuously. The determining of the composition of the regeneration solutions makes it necessary to take account of the stability of the bath, the speed of deposition and the appearance of the coatings.

The regeneration solution of the bath according to the invention has been made in a cell with a effective volume equal to one liter in keeping a ratio of "surface of the substrate" to "volume of electrolyte" equal to about 120 cm²/l. This solution is prepared out of nickel sulfate, sodium tricitrate and sodium hypophosphite in the following proportions, and is shaken mechanically:

0.59 M $NiSO_4$:$6H_2O$ (nickel sulfate @ 155 g/l);
0.12 M $Na_3C_6H_5O_7$:$2H_2O$ (sodium tricitrate @ 35 g/l); and
2.27 M $NaH_2PO_2$:$H_2O$ (sodium hypophosphite @ 200 g/l).

Another ammonia solution diluted to 10% is furthermore used to compensate for the diminishing of the pH due to the oxidation of the hypophosphite and the reduction of the nickel ions during the regeneration of the bath. The quantities of constituents needed to prepare the bath, regenerate it, and deposit one gram of Ni—P alloy are assembled in the table of FIG. 3.

The regeneration of the bath is done manually, in the course of a continuous quantitative analysis of the bath, to recover the initial concentration of the different constituent elements. The addition is done directly after the consumption of 10% of Ni²⁺ ions, typically after about 40 minutes. The pH factor is set at 5.5±0.2 and readjusted by means of the ammonia solution at 10%, after every 30 minutes. The bath is kept at constant temperature, equal to 87° C.±2° C. For this purpose, the cell containing the bath is plunged into a thermostat-controlled bath.

This formulation has made it possible to carry out six "turnovers" with a mean speed of 12 μm/h. One turnover corresponds to the consumption of 6 grams of Ni²⁺ ions per liter of solution. The coatings keep their shiny appearance throughout the regeneration of the bath.

The addition of ammonia solution in a concentration of 10% is done to compensate for the reduction over time, of the pH of the solution. Indeed, the reaction of the oxidation of hypophosphite generates H⁺ protons according to the following reaction:

$$H_2PO_2^- + H_2O \rightarrow H_2PO_3^- + 2H^+ + 2e^- \quad (1)$$

Furthermore, the reduction of the Ni²⁺ ions may also release protons according to the reaction:

$$Ni^{2+} + 2H \rightarrow Ni + 2H^+ \quad (2)$$

and therefore also participate in the acidification of the medium.

The incorporation of phosphorus is done according to the following reaction:

$$H_2PO_2^- + H_{ads} \rightarrow P + OH^{31} + H_2O \quad (3)$$

where $H_{ads}$ represents hydrogen adsorbed into the surface of the substrate. This last-named reaction (3) has an effect opposite that of the first two reactions (1) and (2) but its contribution remains low since the phosphorus content does not exceed 22% in atoms.

In the present state of knowledge, the baths based on citric acid and/or its derivatives are known to be incapable of tolerating large quantities of phosphites. In the case of continuous operation, the values of phosphite content are indeed generally in the range of 0.03 M for values of content of complexing agent in the range of 0.07 M. Furthermore, the ratio of the concentration in phosphites to the concentration in Ni²⁺ ions is of the order of 0.3 to 0.4. These baths therefore have a limited lifetime and can be used to obtain only about 5 g of Ni—P alloy per liter of solution.

The present invention makes it possible to prove the contrary since, in the case of continuous operation, namely when it is regenerated continuously, the bath disclosed herein tolerates a quantity of hypophosphite of about 229 g/l for a quantity of sodium tricitrate of 79 g/l. The ratio of the concentration in sodium hypophosphite to the concentration in Ni²⁺ ions may therefore reach a value of 3 to 4. Furthermore, it is noted that gluconate also stabilizes the bath. Consequently, it is the joint action of citrate and gluconate that enables the bath according to the invention to tolerate hypophosphite concentrations of this kind, yield a large quantity of Ni—P alloy per liter of solution and be long-lived.

The properties of the standard electrolytes of the prior art and of the electrolytes I and II have been studied and compared. The results of these comparisons are assembled in the following table:

|  | Electrolyte I | Electrolyte II | Prior Art |
|---|---|---|---|
| Concentration of nickel salt | 0.1 M (26 g/l) | 0.1 M (26 g/l) | 0.1 M (26 g/l) |
| Concentration of Ni²⁺ ions | 0.1 M (6 g/l) | 0.1 M (6 g/l) | 0.1 M (6 g/l) |
| Concentration of hypophosphite | 0.28 M (24.6 g/l) | 0.33 M (29 g/l) | 0.33 M (29 g/l) |
| Concentration of citrates | 0.2 M (58.8 g/l) | 0.15 M (44 g/l) | citric acid 0.07 M (13.4 g/l) |
| Quantities of gluconate | 0 | 0.0092 (20 g/l) | 0 |
| Weight of Ni—P alloy per liter of solution (after regeneration) | 0.5 g/l | 38 g/l | 5 g/l |
| (lifetime) | (10 minutes) | (7 hours) | (4 hours) |
| % by weight of P in the deposited alloy | 5% | 13% | 10–11% |
| pH | 5.5 | 5.5 | 4.5 to 5.5 |
| T° | 87 °C. ± 2 °C. | 87 °C. ± 2 °C. | 70 to 100 °C. |
| Speed of deposition | 5 μm/h | 12 μm/h | 10–12 μm/h |

These results clearly show that the electrolyte II according to the invention has a greater lifetime and can be used to make a large quantity of Ni—P alloy per liter of solution.

The present invention will be further illustrated by the following example, which is intended to be illustrative in nature and is not to be construed as limiting the scope of the invention.

EXAMPLE

To measure the resistance to corrosion, trials were carried out in a medium with 3% NaCl and this resistance was assessed by measuring the resistance to polarization by electrochemical impedance. The samples tested were substrates on which deposits of Ni—P with a thickness varying from 6 to 8 μm had been made. The composition of Ni—P alloy was determined by dispersion of energy x and the surface condition was observed by means of a scanning electron microscope.

The deposit contains 13% by weight of phosphorus and is homogenous. The alloy has a nodular appearance and has no cracks. Observation with the naked eye shows that the coatings are shiny and less uneven than those obtained with the presently used techniques. Their hardness is in the range of 550 Hv.

The films of Ni—P alloy deposited are amorphous and constitute a non-crystalline matrix in which crystalline nickel inclusions over-saturated with phosphorus are incorporated. The high phosphorus content limits the quantity of these inclusions which are closely related to the capacity of the film to corrode, confirming the excellent resistance to deterioration of the coatings obtained by means of the bath according to the invention. Indeed, the resistance to polarization, which is inversely proportional to the speed of corrosion measured on the steel electrode coated with a layer of Ni—P, is very high, in the range of 10,000 W cm². Consequently, the Ni—P alloys obtained have high resistance to corrosion. This clearly matches the fact that these alloys have great homogeneity.

To test the adhesion, the method involves folding the substrate covered with the Ni—P alloy to an acute angle, and then examining the adhesion at the deformed place. In all the samples tested, the Ni—P layer has high adhesion, which may also be seen during mechanical polishing, when it is difficult to remove the Ni—P layers from the surface of the substrate.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for the deposition of Ni—P alloy on a substrate by self-catalytic chemical means, comprising plunging a substrate directly into a bath comprising nickel sulfate, sodium hypophosphite as a reducing agent, acetic acid as a buffer, traces of lead as a stabilizer, a citrate used as a complexing agent and associated with a gluconate, and the gluconate is used both as a catalyst and as a stabilizer.

2. A method according to claim 1, wherein the substrate is made of iron, mild steel, copper or a non-conductive material.

3. A method according to claim 2, wherein the substrate is copper, and further comprising initiating a self-catalytic reaction by applying a voltage of −1600 mV with respect to a reference silver chloride electrode, to the copper substrate.

4. A method according to claim 1, further comprising regenerating the bath to allow continuous operation by adding a solution comprising nickel sulfate, sodium tricitrate and sodium hypophosphite in the following proportions:

about 0.59 M $NiSO_4:6H_2O$;

about 0.12 M $Na_3C_6H_5O_7:2H_2O$; and about 2.27 M $NaH_2PO_2:H_2O$.

5. A method according to claim 2, further comprising regenerating the bath to allow continuous operation by adding solutions comprising nickel sulfate, sodium tricitrate and sodium hypophosphite in the following proportions:

about 0.59 M $NiSO_4:6H_2O$;

about 0.12 M $Na_3C_6H_5O_7:2H_2O$; and about 2.27 M $NaH_2PO_2:H_2O$.

6. A method according to claim 3, further comprising regenerating the bath to allow continuous operation by adding solutions comprising nickel sulfate, sodium tricitrate and sodium hypophosphite in the following proportions:

about 0.59 M $NiSO_4:6H_2O$;

about 0.12 M $Na_3C_6H_5O_7:2H_2O$; and about 2.27 M $NaH_2PO_2:H_2O$.

7. A method according to claim 4, further comprising adjusting the pH during the regeneration by adding an ammonia solution diluted to 10%.

8. A method according to claim 5, further comprising adjusting the pH during the regeneration by adding an ammonia solution diluted to 10%.

9. A method according to claim 6, further comprising adjusting the pH during the regeneration by adding an ammonia solution diluted to 10%.

10. A method according to claim 1, further comprising a surface treatment comprising polishing the substrates mechanically;

degreasing the substrates with acetone;

cleaning the substrates in a solution of sulfuric acid diluted to 10%; and rinsing the substrates in distilled water.

11. A method for continuously depositing a Ni—P alloy on a substrate comprising:

cleaning the substrate surface to remove any oxide on the substrate surface, immersing the substrate in a bath formed from equal portions of a first solution and a second solution, regenerating the bath with a regenerating solution, adjusting the pH of the bath with a fourth solution, wherein, the first solution comprises nickel sulfate, sodium tricitrate as a complexing agent, and concentrated acetic acid as a buffer, the second solution comprises sodium hypophosphite, sodium gluconate as a catalyst and a stabilizer, and traces of lead as a stabilizer, the regenerating solution comprises nickel sulfate, sodium tricitrate and sodium hypophosphite, and the fourth solution is dilute ammonia.

12. A method as in claim 11 wherein the bath is regenerated when about 10% of $Ni^{2+}$ ions have been depleted from the bath by adding the regeneration solution to the bath.

13. A method as in claim 12 wherein the first solution comprises about 0.1 M $NiSO_4:6H_2O$, about 0.15 M $Na_3C_6H_5O_7:2H_2O$, and about 0.024 M $CH_3CO_2H$, the second solution comprises about 0.33 M $NaH_2PO_2:H_2O$, about 0.092 M $C_6H_{11}NaO_7$, and traces of lead, the regenerating solution comprises about 0.59 M $NiSO_4:6H_2O$, about 0.12 M $Na_3C_6H_5O_7:2H_2O$, and about 2.27 M $NaH_2PO_2:H_2O$, and the fourth solution comprises an ammonia solution diluted to about 10%.

* * * * *

UNITED STATES PATENT AND TRADEMARK OFFICE
CERTIFICATE OF CORRECTION

PATENT NO. : 6,281,157 B1
DATED : August 28, 2001
INVENTOR(S) : Abdallah Tangi, Mohamed Elhark, Ali Ben Bachir, Abdellah Srhiri Mohamed Cherkaoui, Mohamed Ebntouhami, and El Mustapha Saaoudi It is certified that error appears in the above-identified patent and that said Letters Patent is hereby corrected as shown below:

Column 5, Equation 3,
Line 33, should read: -- $H_2PO_2^- + H_{ads} \rightarrow P + OH^- + H_2O$ --

Signed and Sealed this

Twenty-sixth Day of February, 2002

Attest:

JAMES E. ROGAN
Attesting Officer   Director of the United States Patent and Trademark Office